(12) United States Patent
Sandhu et al.

(10) Patent No.: US 7,001,481 B2
(45) Date of Patent: Feb. 21, 2006

(54) METHOD AND SYSTEM PROVIDING HIGH FLUX OF POINT OF USE ACTIVATED REACTIVE SPECIES FOR SEMICONDUCTOR PROCESSING

(75) Inventors: Gurtej S. Sandhu, Boise, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 645 days.

(21) Appl. No.: 09/998,073

(22) Filed: Nov. 30, 2001

(65) Prior Publication Data

US 2003/0102008 A1 Jun. 5, 2003

(51) Int. Cl.
  *C23F 1/00* (2006.01)
(52) U.S. Cl. ............................... 156/345.5; 250/492.2
(58) Field of Classification Search ............ 134/1, 134/1.2, 1.3, 43, 44, 47, 55, 56 R, 93, 94.1, 134/95.1, 105, 184; 15/309.2; 216/60; 156/345.5; 250/492.2
See application file for complete search history.

(56) References Cited

U.S. PATENT DOCUMENTS

| | | |
|---|---|---|
| 4,260,649 A | 4/1981 | Dension et al. |
| 5,607,601 A | 3/1997 | Loper et al. |
| 5,659,383 A | 8/1997 | Ozawa |
| 5,669,979 A | 9/1997 | Elliott et al. |
| 5,814,156 A | 9/1998 | Elliott et al. |

*Primary Examiner*—M. Kornakov
(74) *Attorney, Agent, or Firm*—Dinsmore & Shohl LLP

(57) ABSTRACT

A method and system providing a high flux of point of use activated reactive species for semiconductor processing wherein a workpiece is exposed to a gaseous atmosphere containing a transmission gas that is substantially nonattenuating to preselected wavelengths of electromagnetic radiation. A laminar flow of a gaseous constituent is also provided over a substantially planar surface of the workpiece wherein a beam of the electromagnetic radiation is directed into the gaseous atmosphere such that it converges in the laminar flow to provide maximum beam energy in close proximity to the surface of the workpiece, but spaced a finite distance therefrom. The gaseous constituent is dissociated by the beam producing an activated reactive species that reacts with the surface of the workpiece.

6 Claims, 3 Drawing Sheets

METHOD AND SYSTEM PROVIDING HIGH FLUX OF POINT OF USE ACTIVATED REACTIVE SPECIES FOR SEMICONDUCTOR PROCESSING

BACKGROUND OF THE INVENTION

The invention pertains to semiconductor processing, and in particular to a method and system providing a high flux of point of use activated reactive species for semiconductor processing.

Reactive species are employed in a number of important steps in the processing of semiconductor substrates. For example, reactive species may be employed for removing, or ashing the photoresist, and for etching of siliconiferous, metallic, or ceramic materials. It is known in the prior art to use a laser beam to selectively induce dissociation of a gaseous component to produce the desired gaseous reactive species for such semiconductor processing. Examples of such semiconductor processing systems are disclosed by the following references, which may be relevant to various aspects of the present invention.

U.S. Pat. No. 4,260,649 discloses providing a workpiece in a gaseous environment and a laser beam in close proximity and parallel to the surface of the workpieces in order to produce a gaseous reactant product for reaction with a surface of the workpiece.

U.S. Pat. No. 5,814,156 discloses providing a gaseous reactant in the vicinity of foreign material found on a surface of a substrate to form a non-solid by-product by delivering laser energy to the surface of the substrate to aid the gaseous reactant to react with the foreign material to form the non-solid by-product. The laser energy is arranged to be insufficient to damage the surface of the substrate.

Although the above-mentioned processing systems have been suitable for their intended purposes, one problem with these prior art systems is that they do not provide maximum laser beam energy at the point of use. Since activated gaseous reactive species have very short lifetime, it is therefore highly desirable to provide maximum laser beam energy at the point of use so that a high flux of activated reactive species is generated proximate to the surface of a workpiece.

SUMMARY OF THE INVENTION

The purpose of the present invention is to provide an improved method and system for chemical gas phase processing of workpieces and, more particularly to a method and system providing a high flux of point of use activated reactive species for semiconductor processing.

In one aspect, the invention encompasses a method of chemically treating a surface of a workpiece, comprising exposing the workpiece to a gaseous atmosphere containing a transmission gas that is substantially nonattenuating to preselected wavelengths of electromagnetic radiation. The method further comprises providing a flow of a gaseous constituent over the surface of the workpiece, and directing a beam of the electromagnetic radiation into the gaseous atmosphere. The beam converges in the flow in close proximity to the surface of the workpiece, but spaced a finite distance therefrom, to dissociate the gaseous constituent to produce a high flux of activated reactive species. The method further comprises reacting the activated reactive species with the surface of the workpiece.

In another aspect, the invention encompasses a system for chemically treating a surface of a workpiece comprising a supply of a transmission gas which is substantially nonattenuating to preselected wavelengths of electromagnetic radiation, and a supply of a gaseous constituent. The system further comprises a structure for exposing the workpiece to a controlled gaseous atmosphere containing said transmission gas and for providing a flow of said gaseous constituent to the surface of said workpiece. The system further comprises a radiation beam source adapted to converge in said flow in close proximity to the surface of the workpiece, but spaced a finite distance therefrom, to dissociate said gaseous constituent to produce a high flux of activated reactive species that chemically treat said surface of said workpiece.

These and other features and objects of the present invention will be apparent in light of the description of the invention embodied herein.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION OF THE PREFERRED EMBODIMENTS

Figure 1:
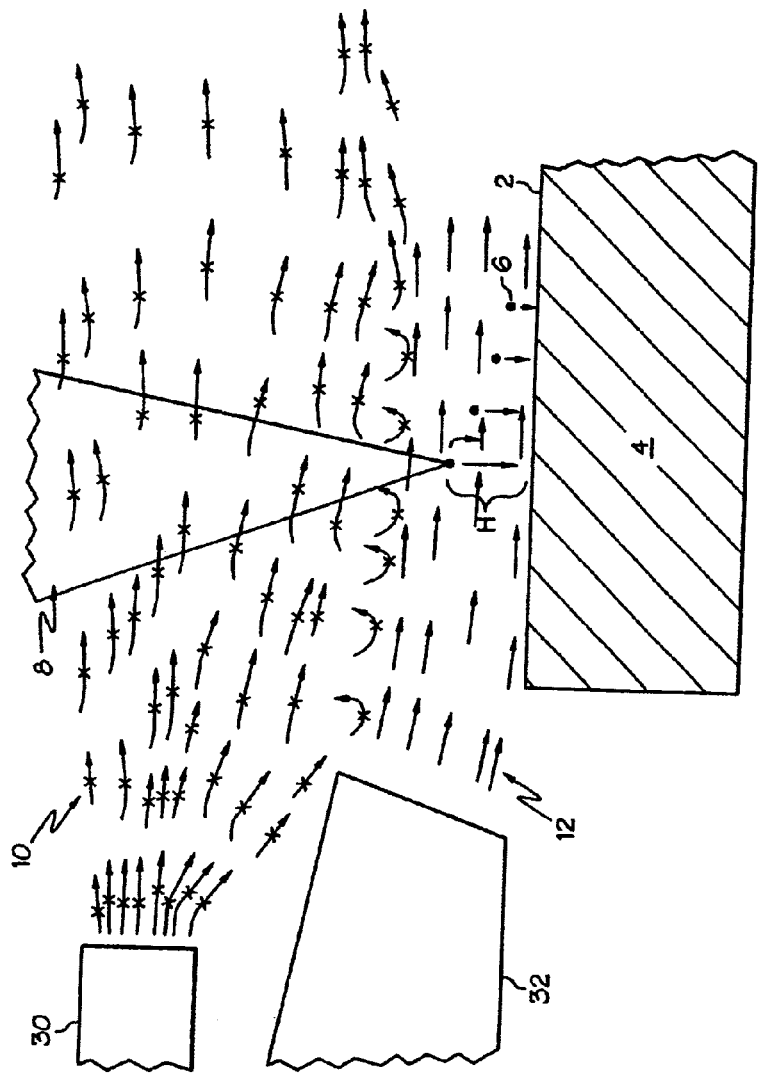
FIG. 1 is an enlarged cross sectional view of a workpiece during a chemical treatment procedure according to the present invention.

In the following detailed description that follows, reference is made to various specific embodiments in which the invention may be practiced. These embodiments are described in sufficient detail to enable those skilled in the art to practice the invention, and it is to be understood that other embodiments may be utilized and that specific equipment, processing steps, energy sources, and other changes may be made without departing from the spirit and scope of the present invention.

The term "workpiece" as used herein includes semiconductor substrate, printed circuits, and other structures that may be chemically treated by the method and system of the invention.

The terms "substrate" as used herein include any semiconductor-based or other structure having an exposed surface in which to form a structure using the apparatus or method of this invention. Substrate is to be understood as including silicon-on-insulator, doped and undoped semiconductors, epitaxial layers of silicon supported by a base semiconductor foundation, and other semiconductor structures. Furthermore, when reference is made to a substrate in the following description, previous process steps may have been utilized to form active devices, regions or junctions in the base semiconductor structure or foundation.

The term "predominantly inorganic" is used to indicate materials where less than 50 weight percent of the dielectric material is carbon. Typically, less than 10 weight percent of the material will be carbon. For instance, the dielectric material can comprise one or more of tantalum pentoxide, aluminum oxide, hafnium oxide, titanium oxide, strontium titanate, barium strontium titanate (BST), and silicon oxynitride. If the dielectric material is formed by chemical vapor deposition there can be a minor amount of carbon within the material due to incorporation of a small amount of carbon-containing components of chemical vapor deposition precursors into the dielectric materials. However, the amount of carbon within the dielectric material will typically be less than 10 weight percent, frequently less than 5 weight percent, and often even less than 1 weight percent.

The method and system of the invention as discussed below generates in close proximity to the surface of the workpiece, but spaced a finite distance therefrom, a high flux of point of use activated reactive species that chemically treats the surface of a workpiece. Examples of such chemical treatments include, but not limited to, film deposition, etching, cleaning, removing photoresist, and other applications which will be apparent to those of skill in the art given the teachings herein.

Specific applications in semiconductor substrate processing suitable for use with the method and system of the present invention of providing a high flux of point of use activated reactive species include removing photoresist by chemically treating material deficient regions on a surface of a semiconductor substrate, plasma-enhanced chemical-vapor deposition (PECVD) of dielectrics, silicon, tungsten nitride ($WN_x$), titanium, aluminum, copper, and other materials; high-rate reactive-ion etching (RIE) of, e.g., thin films of polysilicon, metal, oxides, nitrides, and polyimides; planarized inter-level dielectric formation, including procedures such as biased sputtering; low-temperature epitaxial semiconductor growth processes, and cleaning a surface of a semiconductor substrate by converting foreign material into a gaseous by-product with the activated reactive species.

Additionally, the system and method of the present invention is particular suitable for treating predominantly inorganic dielectric materials. For example, the present invention is suitable for treating dielectric materials with activated oxygen species, as is disclosed by inventors' co-pending application for METHODS OF TREATING DIELECTRIC MATERIALS WITH OXYGEN, AND METHODS OF FORMING CAPACITOR CONSTRUCTIONS, Ser. No.09/945,308, commonly owned by Micron Technology, Inc., and which is herein incorporated by reference. In this application, an activated oxygen species is formed by impacting an oxygen-containing material with a laser beam to change an electronic state of an oxygen component of the material, and thereby generating the activated oxygen species from the oxygen component. The activated oxygen species generated interacts with oxygen-deficient regions of the dielectric material to increase the oxygen content of the material. For instance, the activated oxygen species directly reacts with components of the dielectric material associated with an oxygen-deficient region to bond with such components, and thereby increases the oxygen content of an otherwise oxygen-deficient region of the dielectric material.

Referring to FIG. 1, a preferred, exemplary method for chemically treating a surface 2 of a workpiece 4 with a high flux of a point of use activated reactive species 6 is described. In particular, a laser beam 8 is transmitted through a gaseous atmosphere containing a transmission gas 10 that is substantially nonattenuating to preselected wavelengths of electromagnetic radiation. A laminar flow of a gaseous constituent 12 is then provided over the surface 2 of the workpiece 4 such that the beam 8 converges in the flow in close proximity to the surface of the workpiece, but spaced a finite distance H therefrom, which is less than a few mean-free-path lengths of the gaseous activated reactive species 6. Preferably, the focal point of laser 8 is a distance of from about 2 millimeters to about 4 millimeters above the surface 2 as the laser beam is passed across such surface. The distance of from about 2 millimeters to about 4 millimeters is close enough that the activated species 6 can migrate to the surface 2, and yet far enough that the focal point of the laser beam 8 does not inadvertently impact the surface 2 of the workpiece 4.

Additionally it is to be appreciated that the beam 8 is focused distance H above the surface 4 such that maximum beam energy dissociates the gaseous constituent 12 to produce the high flux of activated reactive species 6 at the point of use. The high flux point of use activated reactive species 6 chemically treated the workpiece 4 by a photoreactive process in which the reactive species 6 is then absorbed by materials on or approximate the surface 2. It is noted that laser beam 8 can generate more than one activated species 6 within the laminar flow, depending on the composition of the gaseous constituent 12, and also depending on the particular wavelength(s) of electromagnetic radiation present in the laser beam 8. Besides reducing laser power loss, the present invention also gives access to new, quickly disappearing metastables that would otherwise disappear and never reach the wafer surface if formed well above the wafer surface. Implementation of the above-described methodology will become apparent from the following discussion of the exemplary embodiments of FIGS. 2 and 3.

Figure 2:
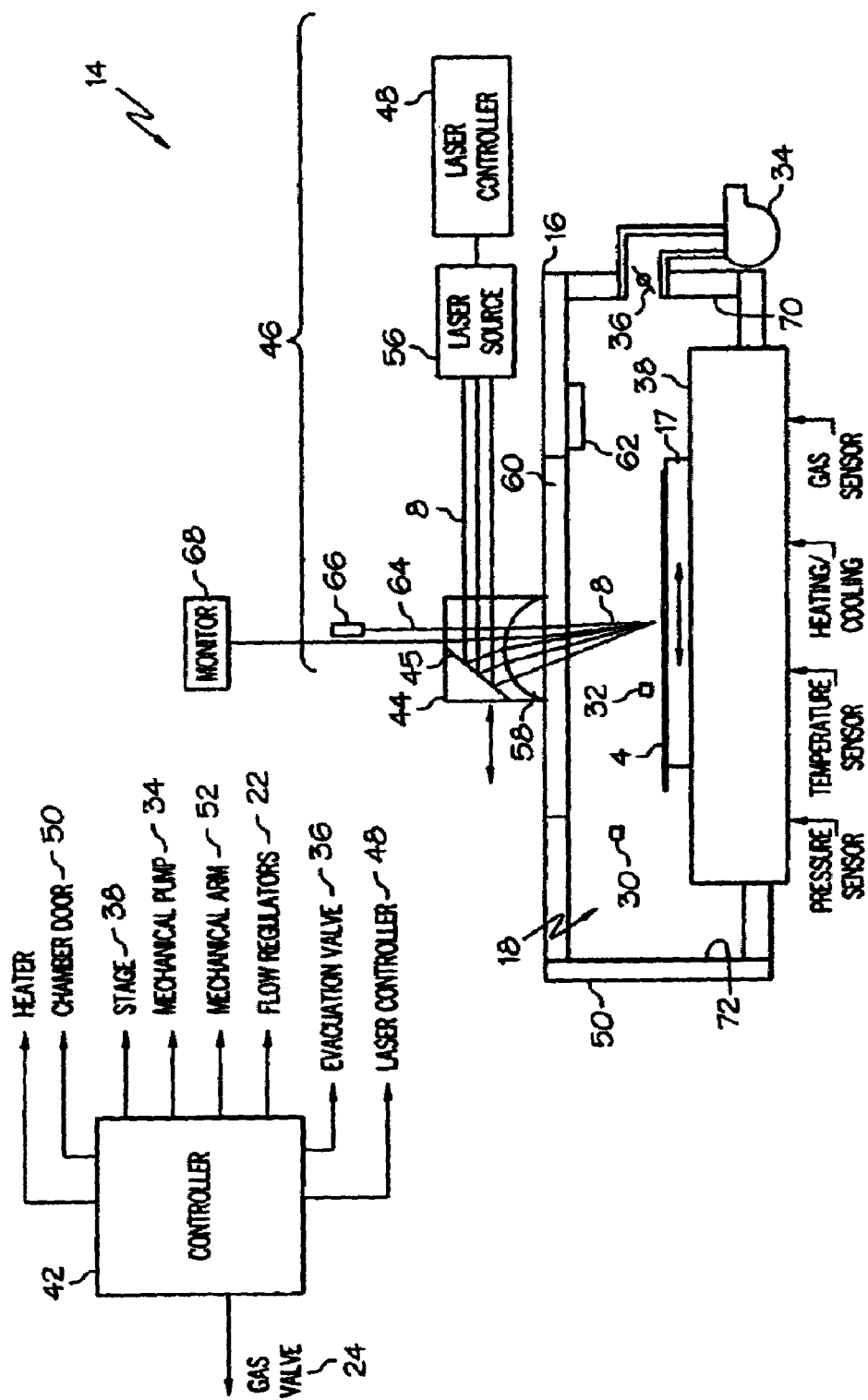
FIG. 2 is a diagrammatic side view of a structure adapted to chemically treat a surface of a workpiece according to the present invention.

FIG. 2 is a diagrammatic sectional side view of the major component parts of an exemplary embodiment of a system 14 which implements the above-described methodology, wherein provided is a chamber 16 for containing the workpiece 4 to be processed. In a typical example, the workpiece 4 comprises a semiconductor wafer of 1 to 8 inches in diameter and 0.127 to 0.89 mm thick and supported upon a conventional chuck 17.

Figure 3:
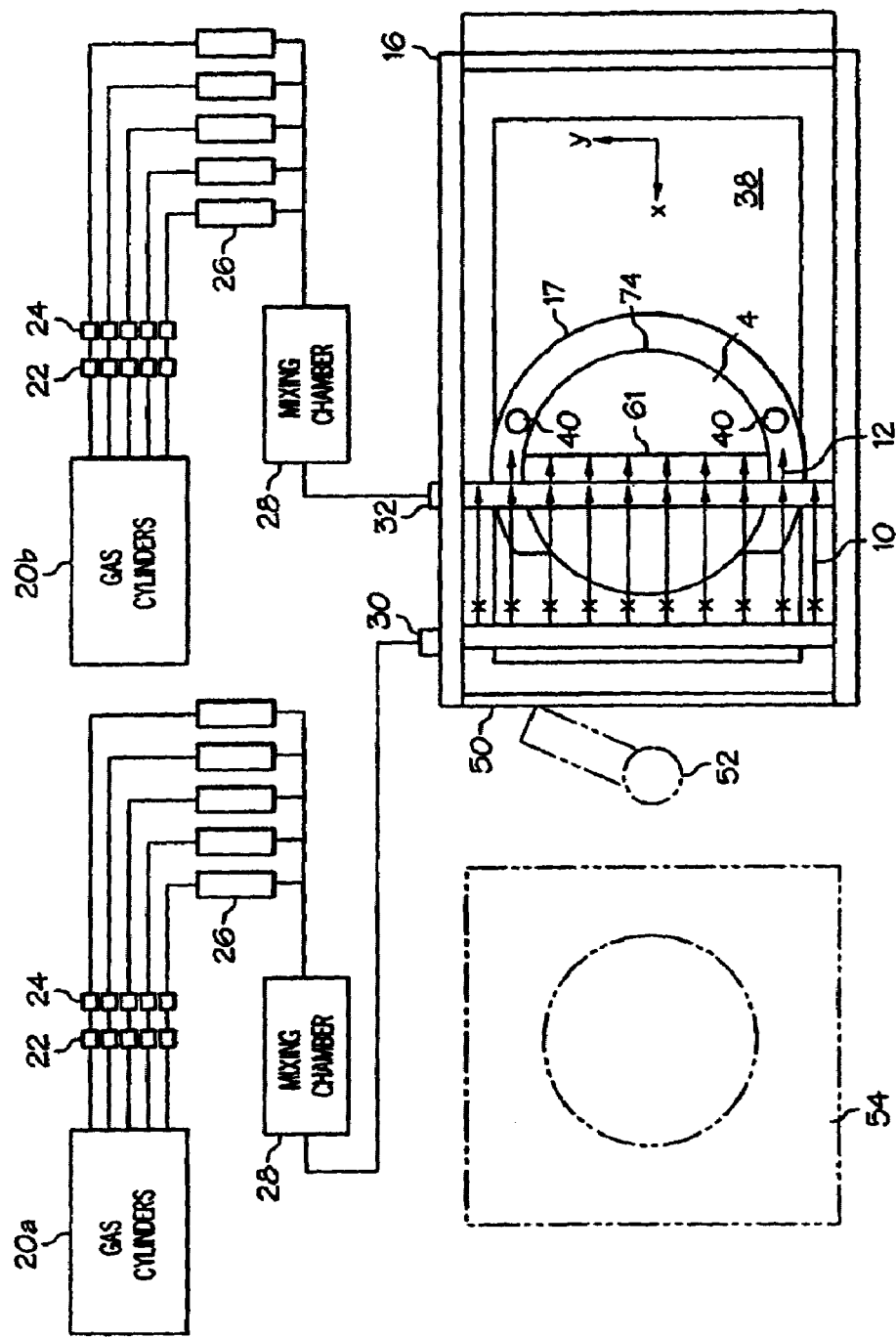
FIG. 3 is a diagrammatic top view of a structure adapted to chemically treat a surface of a workpiece according to the present invention.

The chamber 16 is sealable such that it may contain and hold a subambient pressure of from about 1 Torr to about 10 Torr of the gaseous atmosphere, generally indicated by 18, which is supplied to the chamber from first and second gas sources 20a and 20b, respectively. As illustrated by FIG. 3, the first gas source 20a is in gas communication with the chamber 16 and provides the transmission gas 10 or a mixture of such gasses. The second gas source 20b is also in gas communication with the chamber 16 and provides the gaseous constituent 12. The amounts of the transmission gas 10 and gaseous constituent 12 provided to the chamber 16 from the gas sources 20a and 20b may be regulated in the conventional manner, such as for example, in-line pressure regulators 22, values 24, and mass flow meters 26. When using multiple transmission gases 10 and/or gaseous constituents 12, including other conditioning gas/gases to aid and/or inhibit such chemical processes, conventional mixing chambers 28 may be used to provide a largely homogenous gaseous mixture to the chamber 16.

As shown by FIGS. 2 and 3, the chamber 16 is supplied via first and second feed inlets 30 and 32 with the transmission gas 10 and the gaseous constituent 12, respectively, to create the gaseous atmosphere, indicated by 18. In addition to the first feed inlet 30, additional feed inlets (not shown) may be provided throughout the chamber 12 such that the proper gas volume of the transmission gas 10 is provided therein. Additionally, the second feed inlet 32 is preferably nozzle shaped (FIG. 1) such that the proper gas volume of the reactive constituent is provide as a laminar flow across the surface 2 of the substrate 4. It is to be appreciated that a laminar flow is necessary to prevent gas from spiraling over the surface, creating non-uniform distribution of the activated reactive species 6. As such, baffles may be incorporated into the second feed inlet or nozzle 32 to break up the incoming gas stream into the desired laminar flow. Additionally, the width of nozzle 32 can be made adjustable to optimize the gas flow rate for particular chemically treatments of the surface 2 of the workpiece 4.

The gaseous atmosphere 18 within the chamber 16 is evacuable by a mechanical exhaust pump 34 connected also in gas communication with the chamber via an exhaust valve 36. The gaseous atmosphere 18 within the chamber 16 is controlled by exhausting the gases therein and admitting controlled amounts of the transmission gas 10 and the gaseous constituent 12.

The transmission gas 10 is a gas or mixture of gases that is non-attenuating to predetermined wavelengths of electromagnetic radiation. Such transmission gasses include argon, nitrogen, helium, neon and combinations thereof.

The gaseous constituent is a gas or mixture of gases that absorb predetermined wavelengths of electromagnetic energy and dissociate to form the desired activated reactive species 6. Such gases that include: $O_2$, $O_3$, $CCl_4$, $BCl_3$, $CDF_3$, $CF_4$, $SiH_4$, $CFCl_3$, $F_2CO$, $(FCO)_2$, $SF_5NF_2$, $N_2F_4$, $CF_3Br$, $CF_3NO$, $(CF_3)_2CO$, $CF_2HCl$, $CF_2HBr$, $CF_2Cl_2$, $CF_2Br_2$, $CF_2CFCl$, $CF_2CFH$, $CF_2CF_2CH_2$, $NH_3$, $CHF_3$, fluorohalides, halocarbons, and combinations thereof. Such desired reactive species 6 include: F, $CF_3$, $CF_2$, CF, $NF_2$, NF, Cl, O, $BCl_2$, BCl, FCO, and combinations thereof. It is to be appreciated that the choice of gaseous constituent employed in a photoreactive treatment procedure is guided by the type of chemically treatment process to be carried out.

Depending on the particular parameters used in the chamber 16, other conditioning gases may be used such as to absorb electromagnetic radiation, reduce the concentration of an activated reactant species, or as a catalyst for the reaction between the activated reactive species 6 and the surface 2 of the workpiece 4. As such, a conditioning gas may be employed for controlling the reaction rate between the activated reactive species 6 and the surface 2 of the workpiece 4, or for creating a minimum reaction energy threshold for limiting the production of undesirable reaction products (e.g., ozone and hazardous polymer-based reaction products). Examples of conditioning gas molecules include nitrogen, helium and argon. Nitrogen acts mainly to impede the reaction between material deficient regions and the activated reactive gas, while argon tends to impede the diffusion of the primary reactant gas molecules, rather than to participate in a reaction. Helium behaves in an intermediate manner between nitrogen and argon.

The chamber 16 also contains a translation stage 38 to support the workpiece 4 in the chuck 17 and to move it in and out of the chamber 16. The translation stage 38 is electrically driven, and moves the chuck 17 and workpiece 4 held thereon back and forth within the chamber 16 at a constant rate (e.g., about 6.5 mm/sec) specified by a controller 42. As best illustrated by FIG. 3, protruding banking pins 40 spaced by about 120 degrees hold the workpiece 4 in place on the chuck 17. In one embodiment, the translation stage 38 causes relative motion between the surface 2 of the workpiece 4 and the beam 8 such that the beam sweeps the surface 2 of the substrate 4 during processing. In another embodiment, the workpiece 4 is held stationary during processing, and scanning optics 44 of a laser system 46 are moved to cause the desired relative motion between the surface 2 of the workpiece 4 and the beam 8. In both embodiments, the control of the gaseous constituent flow and atmosphere (shown in FIG. 1) is critical in the small region where the laser beam is focused. Accordingly, in the former embodiment the nozzle 32 may be held stationary with beam 8 and in the latter embodiment may be moved relative to the surface 2 to maintain the desired gaseous constituent flow and atmosphere in the illustrated focusing region of beam 8.

The translation stage 38 can comprise components for temperature control of workpiece 4 during processing. Such components can include one or both of a heating component and a cooling component to maintain the workpiece 4 at a desired temperature. Additionally, the translation stage may include various sensors that monitor pressure, temperature, and gases in chamber 16.

For purposes of controlling a surface treatment sequence, the controller 42 is also connected to in-line pressure regulators 22, gas values 24, mass flow meters 26, exhaust pump 34, exhaust valve 36, translation stage 38, a laser beam controller 48, chamber door 50, and optionally, an electrically driven mechanical arm 52 to move the workpiece 4 in and out of the chamber 16 through the chamber door 50, to and from a transport device/chamber 54.

The laser beam 8 is shaped and delivered to the chamber 12 via the conventional laser system 46 that includes the scanning optics 44, the laser controller 48, and a laser source 56. In particular, the scanning optics 44 typically comprises focusing lenses 58 and one or more mirrors 45 (only one of which is shown). The mirrors 45 direct laser beam 30 towards the focusing lens 58 which shapes the conventional rectangular cross-section beam 8 received from the laser source 56 into a converging beam of electromagnetic energy proximate the surface 2 of the workpiece 4. In one embodiment, the focusing lens 58 forms part of a window 60 of the chamber 16, such as in the embodiment when relative motion is provided between the laser beam 8 and the workpiece 4 by the translation table 38. In other embodiments, the scanning optics 44 along with the focusing lens 58 move relative to the window 60 to provide the desired scanning of the surface 2 of the workpiece 4 with beam 8. The windows 60 may be quartz, sapphire, or zinc selenide. In one embodiment, the focusing lens 58 is a cylindrical refractive lens, and both the lens 58 and window 60 are made from fused silica which allows visual inspection of the chamber 16 during a photoreactive treatment procedure, which is useful for monitoring the progress of a reaction as well as for end-point detection.

Additionally, although laser beam 8 is described as preferably being in the configuration of a long narrow band 61 that extends across the major expanse of the surface 2 of the workpiece 4 during processing, it is to be understood that laser beam 8 can comprise other shapes, such as, for example, a circular beam which is traversed across an entirety of the surface 2 of the workpiece 4 along the shown X and Y axes. Alternatively, the beam can be configured to be wide enough to cover an entirety of the surface of wafer 24 without being passed across such surface. As mentioned previously, the passing of band 61 relative to workpiece 4 can be accomplished by moving one or both of workpiece 4 or the laser beam 8 corresponding to band 61.

Laser source 22 may be an excimer laser (for example, a Cymer CX-2 excimer laser available from Cymer Laser Technologies of San Diego, Calif., USA), which generates a pulsed beam 24 at wavelengths of 248 nm and 193 nm, and adapted to provide beam energy in the range of about 100 to about 5000 $mJ/cm^2$. Other lasers could be used, e.g., a tunable Alexandrite solid state pulsed laser in combination with a frequency multiplier. As shown in FIG. 2, the cross-sectional dimensions of the beam from the laser source 56 may be in the range of 3 mm×5 mm to 5 mm×15 mm. The scanning optics 44 focuses beam 8 so that at distance H above the surface 2 of the workpiece 4, the final beam gives the appearance of a knife edge. In particular, the laser beam 8 can predominantly comprise a single wavelength of ultraviolet light, and such wavelength can be chosen to interact with a specific component of gaseous constituent 12.

A beam dump 62 (FIG. 2) with a surface that strongly absorbs radiant energy in the range 157–250 nm (e.g., a block of hard-anodized aluminum with a row of narrow vanes oriented in the direction of the reflected laser beam), is mounted inside the chamber 16 to receive radiant energy reflected from the surface 2 of the workpiece during processing.

A diagnostic laser beam 64 from a helium-neon laser 66 may be introduced into the chamber 16 through scanning optics 44 with the beam 8 from the laser source 48, and/or through window 60. A monitor 68 could then be configured to receive a reflected diagnostic beam 64 to verify that the surface 2 has been treated without having to remove the workpiece 4 from the chamber 16 (e.g., by interferometric or light scattering techniques well-known in the field of surface analysis). A discussion on chemically treating the surface 2 of the workpiece 4 with an exemplary embodiment of the present invention now follows.

Operation

Prior to treatment, an appropriate set of reaction parameters (e.g., energy wavelength, energy density of the incident laser beam, gas composition, pressure and mass flow rates of transmission gas and gaseous constituent inside the reaction chamber, stage translation rate, and temperature of workpiece) are selected. These will depend on the type of chemical treatment that the workpiece 4 is to undergo.

Once the type of chemical treatment has been identified and the parameters selected, the workpiece 4 is loaded into the chamber 16 through door 50, preferably from the transport device/chamber 54, and is positioned on the wafer chuck 17 against banking pins 40, preferably by mechanical arm 52, with the surface 2 to be treated facing up.

Mechanical pump 34 pumps on the chamber 16 until a pressure of between about 1 and about 10 Torr is achieved, at which point the stage 38 translates the chuck 17 and workpiece 4 at a constant rate across the chamber 16 from a rear end 70 to a forward end 72 (FIG. 2), and the controller 42 electrically activates the gas value 22 to coordinate delivery of the transmission gas 10 (FIG. 1), specified by mass flow regulators 26, from gas cylinders 20a, through inlet 30.

As soon as a forward edge 74 (FIG. 3) of the workpiece 4 is positioned properly such that the beam 8 may initiate the production of the high flux of point of use activated reactive species 6, the controller 42 electrically actuates the gas valve 22 to coordinate the delivery of the laminar flow of the gaseous constituent 12 (FIG. 1), specified by mass flow regulators 26, from gas cylinders 20a, through nozzle 32. Typically, the flow of gaseous constituent is provided over the surface of the workpiece in the form of a layer having a limited thickness. For example, the thickness of the layer may be less than about 10 mm but should be at least large enough to accommodate the focal point of the laser source 56. When the pressure within the chamber 16 reaches a desired pressure (e.g., between 10 Torr and 1 atmosphere), the controller 42 activates laser source 56, via laser controller 48 in which pulses of the laser beam 8 are directed into the gaseous atmosphere 18 of the chamber 16.

In particular, the beam 8 is directed through the transmission gas 10 and converged in the laminar flow of the constituent gas 12 to provide maximum beam energy in close proximity to the surface 2 of the substrate 4, but spaced the finite distance H therefrom. The converging beam 8 of electromagnetic radiation dissociates the gaseous constituent 12 and produces a high flux of activated reactive species 6 which react and chemically treat the surface 2 of the workpiece 4. The resulting gaseous products (not shown) produced from the interaction of the activated reactive species 6 and the surface 2 of the workpiece 4 may be removed from the chamber 16 through evacuation by mechanical pump 34.

After the entire surface 2 of the workpiece 4 has been passed beneath the laser beam 8, and depending on the kind of processing the workpiece 4 was subjected to prior to being treated in chamber 16 and the type of post-processing the workpiece 4 is to undergo, the surface 2 of the workpiece 4 may be treated as many times as required without removing the workpiece from the chamber 16, and if desired, under different reaction conditions. It may be necessary, for example, to proceed with a surface oxide treatment procedure subsequent to a surface treatment targeted to implant organic molecules. This is because during an organic treatment sequence, metals, as well as the silicon substrate, may become oxidized.

Once the surface 2 of workpiece 4 has been treated, the gas valves 22 are closed, the chamber is purged in a conventional manner with nitrogen gas from gas source 20a, and the workpiece 4 is then removed from the chamber 4.

An advantage of methodology of the present invention is that it generates a high flux of activated species proximate a surface of a workpiece which is to be treated with such activated species. Another advantage is that the laser beam is utilized to generate activated species, rather than being utilized to directly impact the surface of the workpiece. In other words, the laser light is utilized to generate a migratory reactive species, rather than being directly utilized in any reaction occurring on the surface of the workpiece. Accordingly, the laser light can be focused at varying locations relative to surface of the workpiece, and yet the migratory reactive species will traverse to the surface of the workpiece and react therewith.

In contrast, if the laser light were utilized directly in a reaction with the surface material, a focal point of the laser light would typically be directed at the surface of the workpiece. Such can be problematic in applications, such as for example, in which a dielectric material has an undulating upper surface, as it can be difficult to keep the laser beam focused on such undulating surface as the laser beam is passed across the surface. Another problem can occur in the difficulty of hitting vertical walls or surfaces with the laser energy. However, methodology of the present invention is simplified relative to processes in which a laser beam is focused at a surface of the workpiece in that the present invention can utilize a laser beam which is focused within a range of locations above a surface of the workpiece. It is to be understood, however, that the invention can also encompass embodiments wherein the laser beam is focused at the surface of the workpiece and generates the reactive species against such surface, but such embodiments are generally less preferred than embodiments in which the laser beam is focused at a location above the surface of the workpiece.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents. Any modification of the present invention which comes within the spirit and scope of the following claims should be considered part of the present invention.

What is claimed is:

1. A system for treating a surface of a workpiece with electromagnetic radiation, said system comprising:
 a first gas source configured to provide a transmission gas defined by a first radiation absorption coefficient;
 a second gas source configured to provide a gaseous constituent defined by a second radiation absorption coefficient such that said gaseous constituent is more absorptive of said electromagnetic radiation than said transmission gas;
 a chamber comprising:
  a workpiece-containing portion; and
  an inlet configured to establish fluid communication between said first and second gas sources and said chamber such that a gaseous atmosphere is defined therein, said gaseous atmosphere comprising a first region spaced from said workpiece surface and configured to accept said transmission gas, and a second region disposed between said first region and said workpiece surface and configured to accept said gaseous constituent; and
 an electromagnetic radiation source configured such that upon operation of said electromagnetic radiation source, a beam produced thereby converges in said second region in close proximity to, but not on, said workpiece surface to dissociate said gaseous constituent into an activated species that chemically reacts with said workpiece surface.

2. The system of claim 1 wherein said inlet is configured such that during operation of said system, flow of said transmission gas and said gaseous constituent in said first and second regions is laminar.

3. The system of claim 1 wherein said first gas source is configured to supply gas selected from the group consisting of helium, neon, argon, nitrogen and combinations thereof.

4. The system of claim 1 wherein said second gas source is configured to supply gas selected from the group consisting of $O_2$, $O_3$, $CCl_4$, $BCl_3$, $CDF_3$, $CF_4$, $SiH_4$, $CFCl_3$, $F_2CO$, $(FCO)_2$, $SF_5NF_2$, $N_2F_4$, $CF_3Br$, $CF_3NO$, $(CF_3)_2CO$, $CF_2HCl$, $CF_2HBr$, $CF_2Cl_2$, $CF_2Br_2$, $CF_2CFCl$, $CF_2CFH$, $CF_2CF_2CH_2$, $NH_3$, $CHF_3$, fluorohalides, halocarbons and combinations thereof.

5. The system of claim 1 wherein said electromagnetic radiation is of a predetermined wavelength.

6. The system of claim 5 wherein said predetermined wavelength is between approximately 190 and 250 nanometers.

* * * * *